United States Patent

Kunzel

[11] Patent Number: 5,997,316
[45] Date of Patent: Dec. 7, 1999

[54] SLIDE-LOCK TEST SOCKET ASSEMBLY

[75] Inventor: Walter Albert Kunzel, Middlesex, N.J.

[73] Assignee: TWP, Inc., Cranford, N.J.

[21] Appl. No.: 09/097,074

[22] Filed: Jun. 12, 1998

[51] Int. Cl.[6] ........................................... H01R 9/09
[52] U.S. Cl. .............................................. 439/73; 439/331
[58] Field of Search .................................. 439/70, 71, 72, 439/73, 331

[56] References Cited

U.S. PATENT DOCUMENTS

| | | | |
|---|---|---|---|
| 4,832,612 | 5/1989 | Grabbe et al. | 439/71 |
| 5,127,837 | 7/1992 | Shah et al. | 439/73 |
| 5,244,404 | 9/1993 | Kishi et al. | 439/331 |
| 5,468,158 | 11/1995 | Roebuck et al. | 439/73 |
| 5,738,531 | 4/1998 | Beaman et al. | 439/71 |
| 5,766,022 | 6/1998 | Chapin et al. | 439/73 |
| 5,793,618 | 8/1998 | Chan et al. | 439/73 |
| 5,816,828 | 10/1998 | Ikeya at al. | 439/73 |

Primary Examiner—Khiem Nguyen
Assistant Examiner—T C Patel
Attorney, Agent, or Firm—Arthur L. Lessler

[57] ABSTRACT

A test fixture for integrated circuits, particularly those having large numbers of contacts. The fixture has a socket for receiving the integrated circuit, with conductive wad pins of the socket contacting lands or solderballs of the integrated circuit. Four clamping and alignment studs having peripheral grooves near their upper ends extend upward from the four corners of the socket. A lid is pivoted about a hinge pin which goes through bearing holes in the two studs and the lid. A pressure pad is resiliently suspended from the lid for applying pressure to the upper surface of an integrated circuit disposed in the socket. A slide-lock plate is mounted on the upper surface of the lid. A pressure pad screw extends from a position above the slide-lock plate, through a hole in the slide-lock plate, to engage threads of the central hole of the lid to apply pressure to the pressure pad when the pressure pad screw is rotated. The slide-lock plate is slidable between an open position in which the upper portions of the studs extend through the slide-lock plate, which can then be opened by rotating the slide-lock plate and lid about the hinge, and a locked position in which the slide-lock plate is moved so that narrowed portions of its slots engage the peripheral grooves of the studs. When in the locked position, controlled pressure is applied to the pressure pad and integrated circuit by rotating a lever attached to the pressure pad screw.

20 Claims, 6 Drawing Sheets

10 — TEST SOCKET ASSEMBLY

10 — TEST SOCKET ASSEMBLY

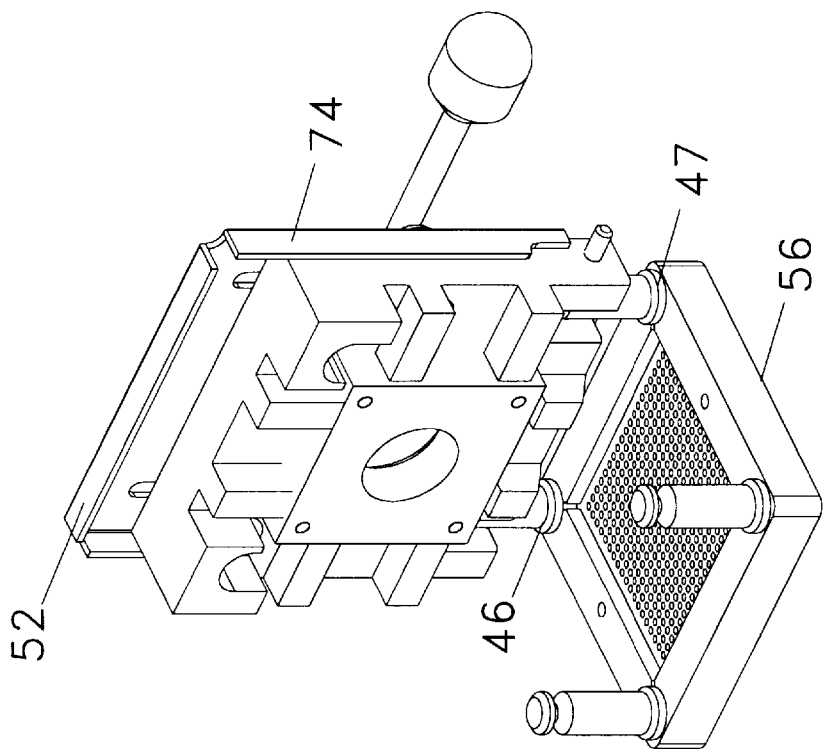
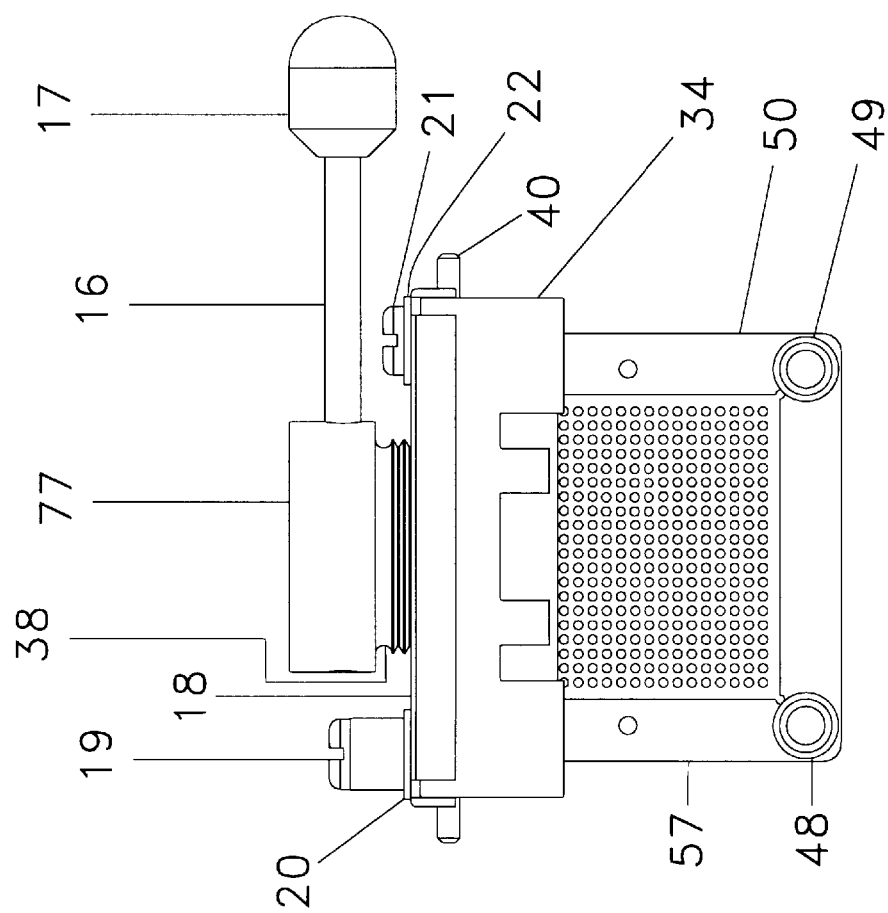

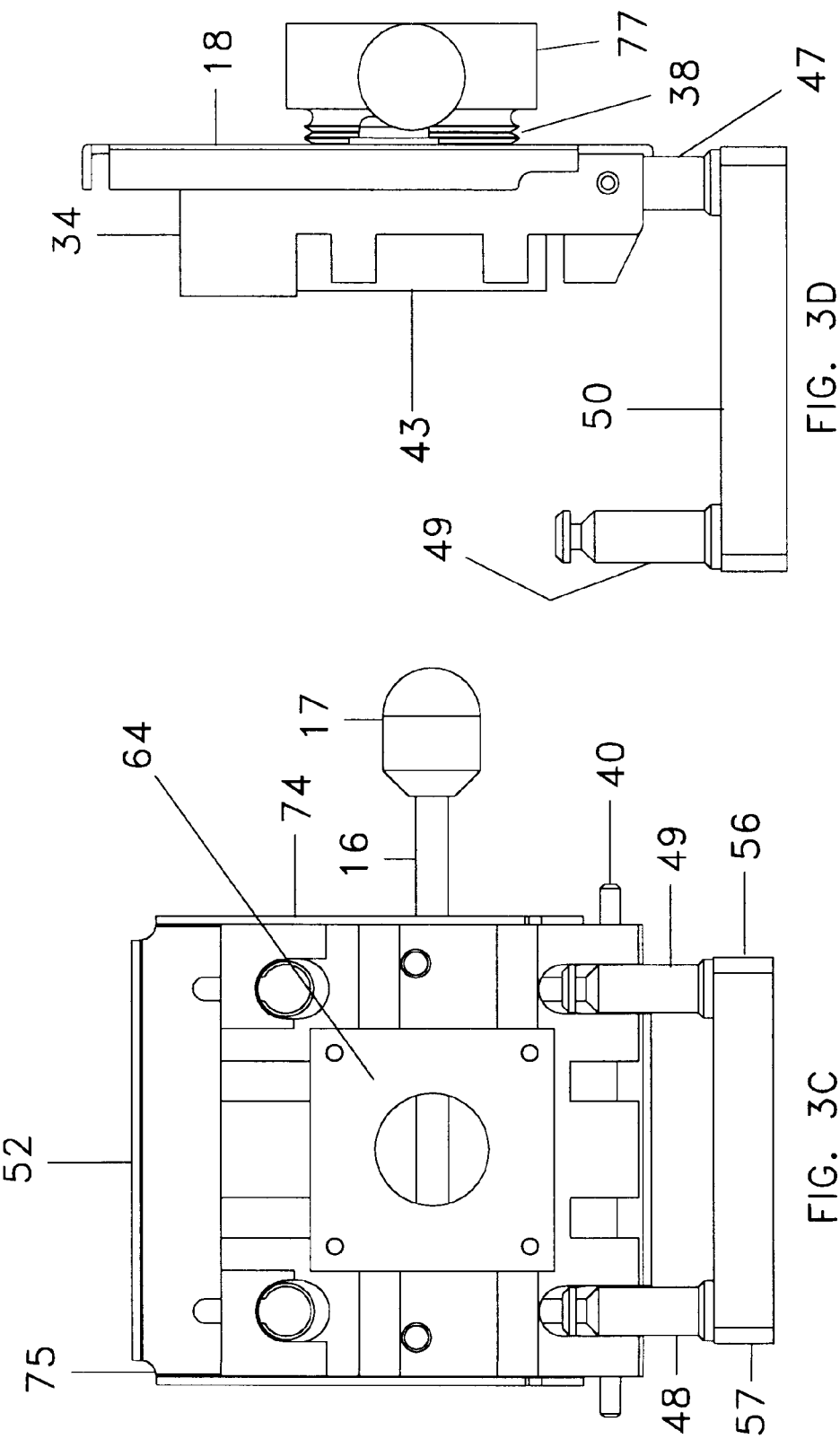

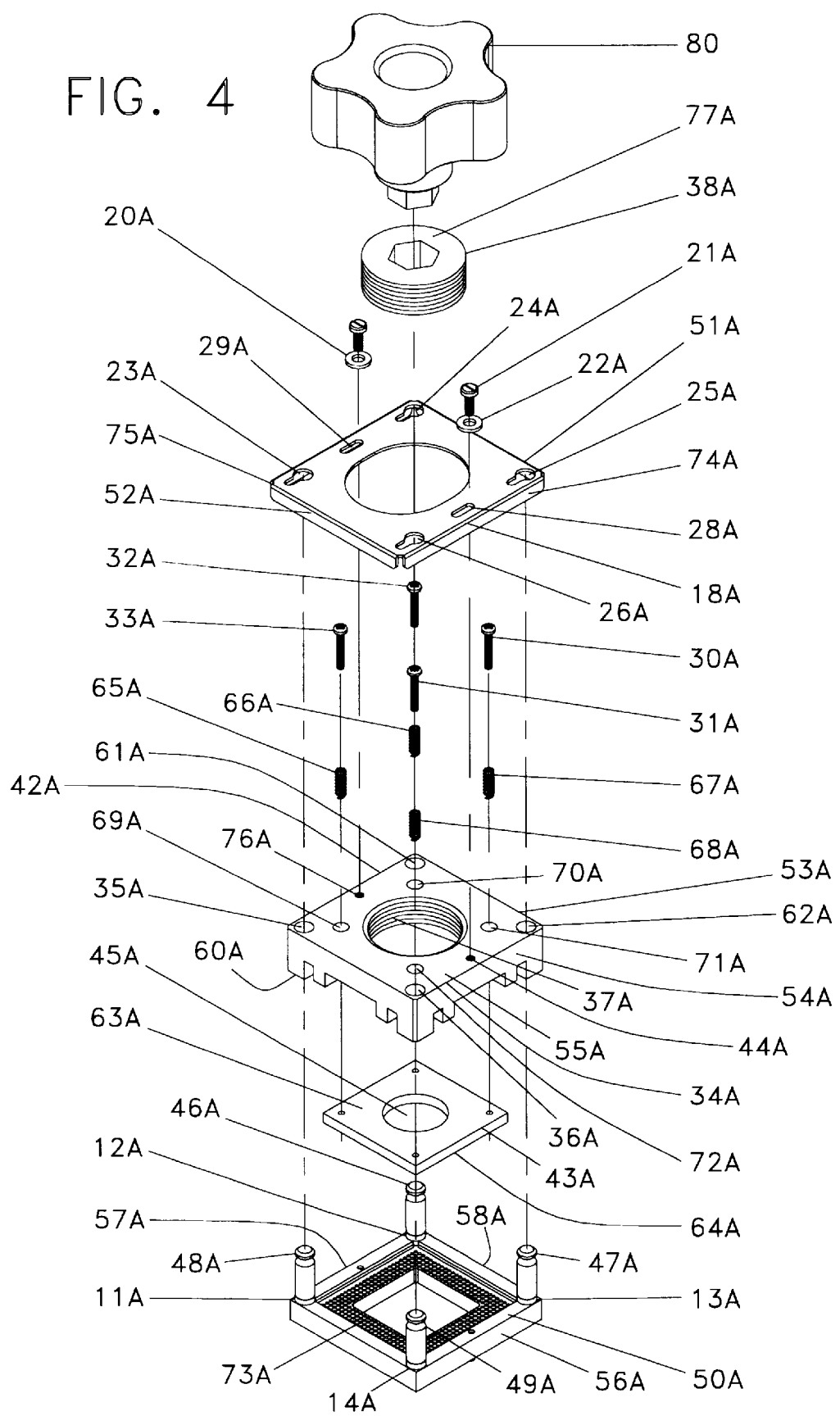

SLIDE-LOCK TEST SOCKET ASSEMBLY

BACKGROUND OF THE INVENTION

This invention relates to a socket assembly for electrically connecting integrated circuits to printed circuit boards, primarily for testing purposes, in such a manner that the integrated circuits may be rapidly and securely electrically connected to and disconnected from the circuit boards.

Modern integrated circuits have multiple terminals, usually in the form of conductive solderballs, pins or lands which are of relatively small size and positioned relatively close together. For various reasons, including but not limited to the difficulty and expense of removing such integrated circuits from printed circuit boards to which they are affixed in the manufacture of computers and other electronic devices, it is preferable to test each integrated circuit before it is affixed to a printed circuit board.

Various test fixtures are commercially available for temporarily electrically connecting an integrated circuit to a printed circuit board for testing purposes. This is frequently accomplished by incorporating a conductive wad type integrated circuit socket in the test fixture. In such an arrangement the socket has a multiplicity of holes arranged to align with corresponding solderballs, pins or lands of the integrated circuit, each hole being filled with a conductive wad which protrudes slightly above the adjacent socket surface to contact a corresponding land.

Test fixtures of this type incorporate a hinged or spring loaded closing latch to urge a cover lid and pressure pad against the top of an integrated circuit which is positioned in the socket with its lower surface bearing the contact lands which engage corresponding conductive wad contact elements. However, as the complexity of integrated circuits has grown, the number of contact lands has likewise increased, to the point where a single integrated circuit may have over 1,000 solderballs, pins or contact lands.

In order to insure high reliability of temporary electrical interconnection of such integrated circuits to the corresponding sockets, relatively high contact pressures are needed, the reliability of conventional hinged and spring loaded closing latches being less than adequate for this purpose. Standard latch type integrated circuit test fixtures have the additional disadvantage that there is significant risk of the latch popping open when the fixture is used to test such high contact count integrated circuits.

Accordingly, an object of the present invention is to provide an improved integrated circuit test fixture capable of reliably applying relatively high contact pressures to high contact count integrated circuit temporary electrical interconnections, while facilitating rapid insertion and removal of integrated circuits to be tested.

SUMMARY OF THE INVENTION

As herein described, there is provided a socket assembly for electrically connecting an integrated circuit to a printed circuit board.

The assembly comprises an integrated circuit socket for accommodating an integrated circuit, the socket having an array of contacts arranged to engage corresponding contacts of the integrated circuit. The socket has upwardly extending clamping and alignment means.

The assembly includes a lid having upper and lower major surfaces with a generally central internally threaded circular hole extending between these surfaces. The lid has alignment means for engaging the alignment means extending upwardly from the socket. Pressure pad retaining means is secured to the lid. A pressure pad is disposed below the lid and substantially parallel to its lower major surface. The pressure pad is mounted to the pressure pad retaining means so the pad can move toward and away from the lower major surface of the lid. The pressure pad is dimensioned to urge an integrated circuit accommodated in the socket toward the socket so that the contacts of the integrated circuit engage the corresponding array of contacts of the socket.

A slide-lock plate is slidably mounted on the upper major surface of the lid for movement toward and away from an end surface of the lid. The slide-lock plate has means for engaging the clamping means of the socket.

Means is operatively associated with the lid for urging the pressure pad toward the socket, to cause the pressure pad to press an integrated circuit accommodated in the socket against the socket so that the contacts of the integrated circuit engage the corresponding array of contacts of the socket.

IN THE DRAWING

FIG. 3A is an isometric view of the test socket assembly of FIG. 1, shown in its open position;

FIG. 3B is a top plan view of the test socket assembly of FIG. 1, shown in its open position;

FIG. 3C is a bottom plan view of the test socket assembly of FIG. 1, shown in its open position;

FIG. 3D is a front elevation view of the test socket assembly of FIG. 1, shown in its open position;

FIG. 4 is an exploded isometric drawing of a test socket assembly according to a second embodiment of the invention.

DETAILED DESCRIPTION

Structure of the First Embodiment of the Test Fixture

Figure 1:
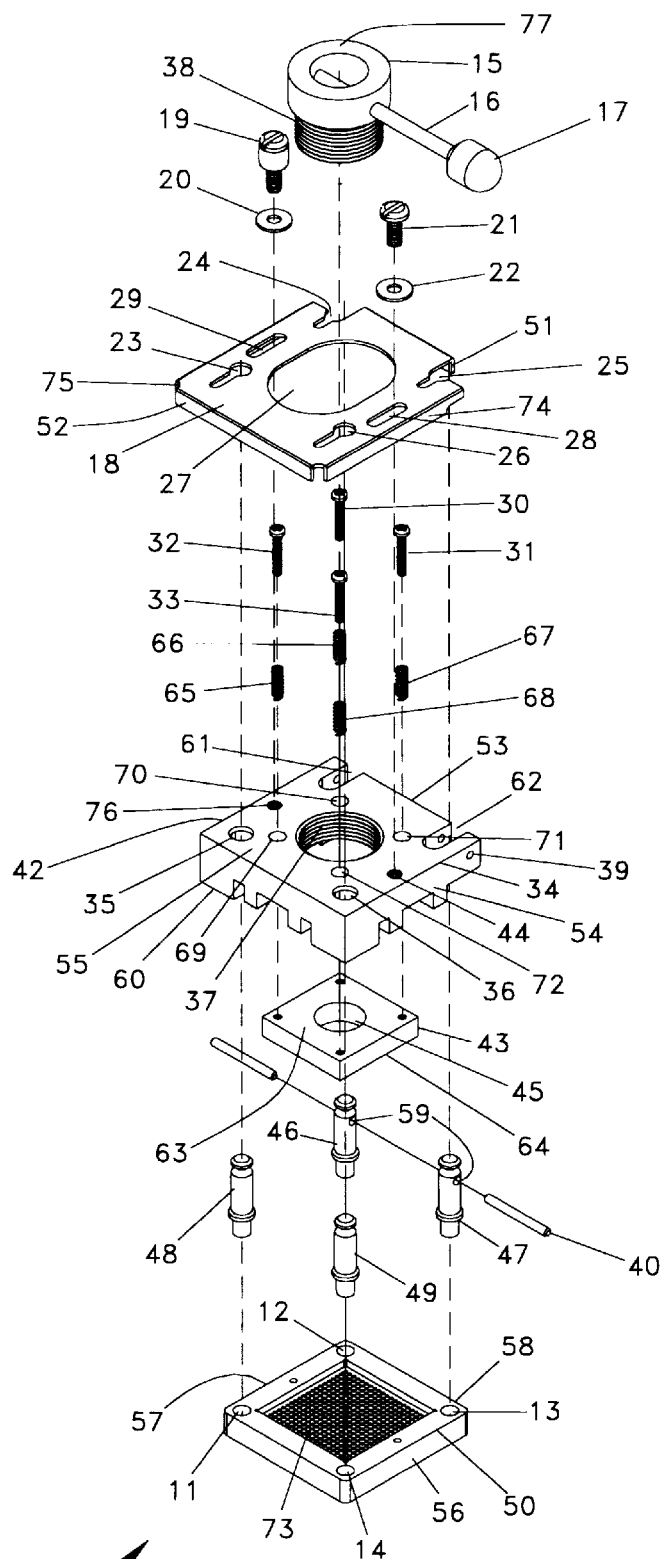
FIG. 1 is an exploded isometric view of a slide-lock test socket assembly according to a first embodiment of the present invention.
Figure 2:
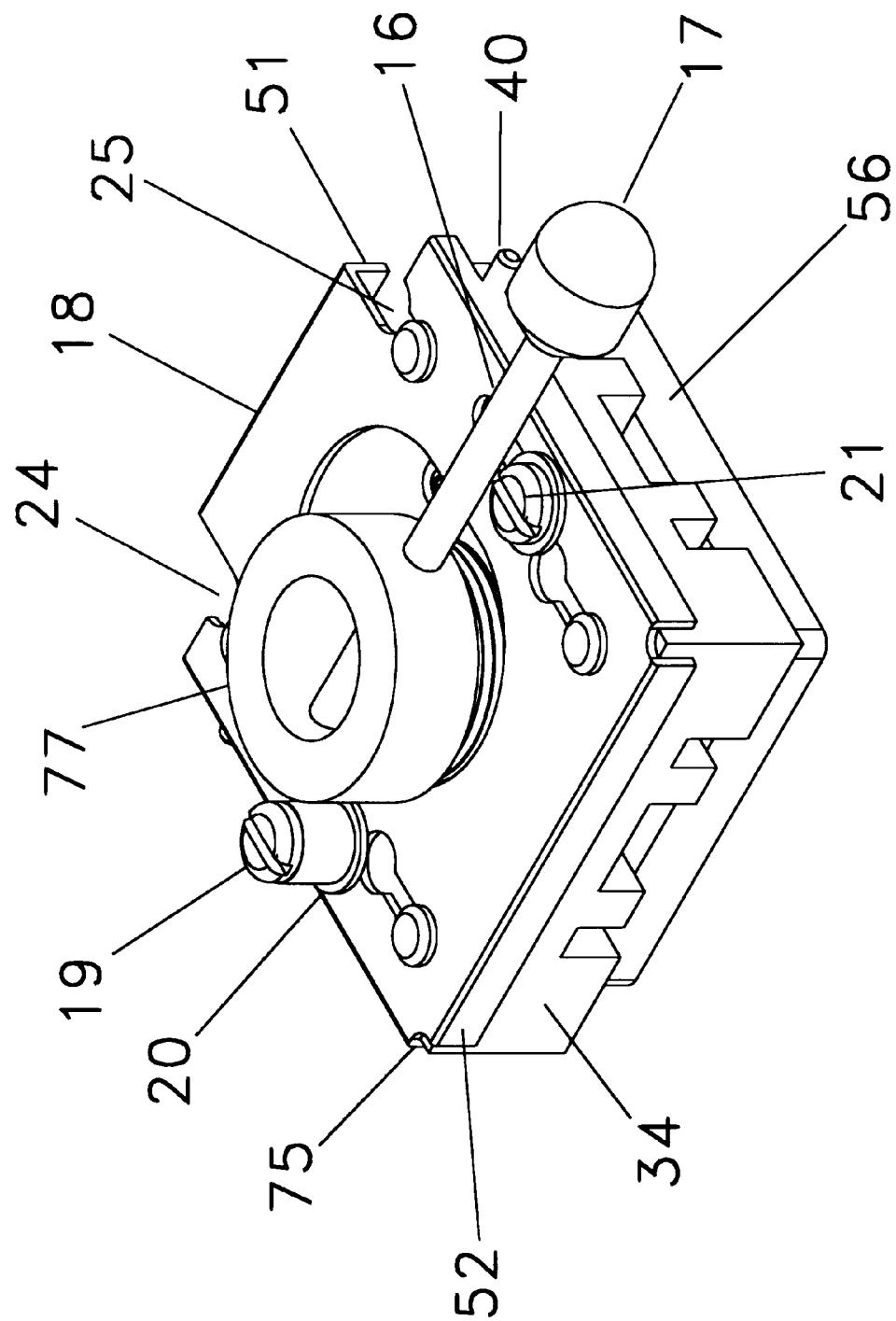
FIG. 2 is an isometric view of the test socket assembly of FIG. 1, shown in its closed, i.e. testing position.

As seen in FIG. 1, the test socket assembly or test fixture 10 has an integrated circuit socket 50 made of ceramic or plastic material. The socket shown has 399 pins arranged in a 20 pin by 20 pin array, with the elimination of one corner pin for orientation purposes.

Each of the pins consists of a conductive metal wad which protrudes slightly above the adjacent socket surface, each wad being adapted to resiliently engage a corresponding solderball, pin or land of an integrated circuit placed within the socket 50. Such sockets are known in the art and are commercially available from TWP, Inc. t/a Tecknit, the assignee of the present application.

The socket 50 has four peripheral holes 11 through 14, each of which receives a lower end portion of a corresponding one of the clamping and alignment studs 46 through 49. Each stud is preferably retained in the corresponding hole by means of a screw (not shown) having a head countersunk into the lower surface of the socket, which screw threadably engages an axial hole of the corresponding stud. Alternatively, the studs may be press fitted into the corresponding holes.

Each of the clamping and alignment studs 46 through 49 has an upper end portion having a peripheral slot therein.

Although these peripheral slots are shown in the drawing as being circumferential, they need not go entirely around the corresponding studs, but need be present only in the regions substantially parallel to the socket side surfaces 56 and 57.

The two studs 47 and 48 which are adjacent to the socket end surface 58 have collinear bearing holes 59 for accepting a hinge pin 40.

Disposed above the socket 50 is a lid 34 having an upper major surface 55, a lower major surface 60, and a generally central internally threaded circular hole 37 extending between said major surfaces. Four stud receiving holes 35, 36, 61 and 62 also extend between said major surfaces; the stud receiving holes 61 and 62 being open to the lid end surface 53. Bearing holes 39 extend between the lid side surfaces 54 and 42 in a direction generally parallel to the lid end surface 53. The hinge pin 40 extends through the bearing holes 39 as well as (as previously mentioned) the stud bearing holes 59.

A pressure pad 43 has an upper major surface 63 adjacent the lower major surface 60 of the lid 34, and a lower major surface 64 adjacent the socket 50. The major surfaces of the pressure pad 43 are generally parallel to those of the lid 34. The pressure pad 43 may if desired have a hole 45 in the center thereof to provide access to the device under test.

The pressure pad 43 is retained in a resilient manner, in a position adjacent the lid 34 by pressure pad retaining means comprising pressure pad retention screws 30 through 33 and pressure pad springs 65 through 68, each of which surrounds a major part of the shaft of a corresponding one of the pressure pad retention screws.

The heads of the screws 30 through 33 are countersunk into the upper major surface 55 of the lid 34, and the lower ends of said screws are threaded into corresponding holes in the upper major surface 63 of the pressure pad 43. The lengths of the screw shafts are such that the pad 43 may move a predetermined distance below the lower major surface 60 of the lid 34, movement of the pressure pad 43 being accommodated by sliding movement of the screws 30 through 33 within the (non-threaded) holes 69 through 72; the upper ends of the screws 30 through 33 being free to move up and down through the oval hole 27 in the slide plate 18 as the pressure pad 43 moves towards and away from the lid 34.

The pressure pad 43 is dimensioned to fit within the contact pin-containing recess of the socket 50, so as to press any integrated circuit disposed within the socket against the array 73 of conductive wad contact pins.

The slide-lock plate 18, preferably made of non-magnetic sheet metal, is disposed on and slidably mounted to the upper major surface 55 of the lid 34, and has parallel side flanges 74 and 75, and slide limiting end flanges 51 and 52.

Slots 28 and 29 are disposed on opposite sides of the oval hole 27 adjacent the side surfaces 74 and 75. Slide-lock plate screws 21 and 19 extend through washers 20, 22 and slots 28 and 29 respectively to threadably engage slide-lock plate screw holes 44 and 76 respectively, so as to retain the slide-lock plate 18 adjacent the upper major surface 55 of the lid 34.

The slide-lock plate 18 has clamping and alignment stud receiving slots 23, 24, 25 and 26 for receiving upper end portions of the clamping and alignment studs 46 through 49 respectively. Each of the slots 23 through 26 has a generally circular portion through which a corresponding clamping and alignment stud extends when the test fixture 10 is in its unlocked position, and a narrowed portion which engages a corresponding peripheral groove of the corresponding stud when the slide-lock plate 18 is slid (with respect to the lid 34) to its locked position, i.e. toward the lid end surface 53.

Means for applying pressure to the pressure pad 43 to press it against an integrated circuit disposed within the socket 50, is provided by means of the pressure pad screw assembly 15, which consists of an externally threaded pressure pad screw 77, a pressure pad screw lever 16, and a pressure pad screw knob 17.

The oval hole 27 within the slide-lock plate 18 is sufficiently elongated and dimensioned so that the threaded hole 37 through the lid 34 is exposed through the oval opening 27 in both the locked and unlocked positions of the slide-lock plate 18, as well as intermediate positions. Thus the external threads 38 of the pressure screw 77 at all times engage the internal threads of the hole 37 in the lid 34 without interference by the slide-lock plate 18.

The slide-lock plate screw 19 has an enlarged head which extends vertically a sufficient distance so as to act as a stop to limit turning of the pressure pad screw lever 16 and thereby limit the angle of rotation of the screw 77, so as to prevent application of excessive pressure to an integrated circuit to be tested, and at the same time speed up the testing operation.

The stud receiving slots 24 and 25 which are adjacent to the slide-lock plate end surface 51 and the hinge pin 40, are open so that the slide-lock plate 18 may clear the studs 47 and 48 when the test fixture is opened by rotating the lid 34 and slide-lock plate 18 about the hinge pin 40. Similarly, the stud receiving holes 61 and 62 of the lid 34 are open adjacent the lid end surface 53, to provide similar clearance of the studs 47 and 48 when the test fixture is opened.

Operation of the First Embodiment of the Test Fixture

The test fixture is used by moving the pressure pad screw knob 17 counterclockwise (in top plan view) until the lever 16 contacts the pressure pad screw lever stop screw 19, so as to relieve pressure on the pressure pad 43 and the integrated circuit under test.

Then the slide-lock plate 18 is slid away from the lid end surface 53 by pressing on the slide stop flange 51, to move the slide-lock plate 18 to a position wherein the generally circular portions of the slots 23 through 26 are aligned with the studs 46 through 49. Then the lid 34 and slide-lock plate 18 are manually rotated about the hinge pin 40 to open the test fixture, and the integrated circuit within the socket 50 is removed.

The next integrated circuit to be tested is positioned within the socket 50 so that its solderballs, pins or lands are in contact with corresponding conductive wad pins of the socket pin array 73, which pins are electrically connected to test equipment (not shown).

Prior to installation of the pressure pad screw lever stop screw 19, the pressure pad screw 77 is rotated to a position which takes into consideration the thickness of the integrated circuit to be tested, so that the screw 77 will apply the desired pressure to the pressure pad 43 when the pressure pad screw knob 17 is turned to move the pressure pad screw lever 16 to a position abutting the pressure pad screw lever stop screw 19.

The integrated circuit to be tested is positioned so that its solderballs, pins or lands are properly oriented to the contacts of the socket array 73. Then the lid 34 and slide-lock plate 18 are rotated about the hinge pin 40 to close the test fixture, and the slide-lock plate 18 is moved towards the lid end surface 53 by pressing on the slide-lock plate stop flange 52, so that the narrowed portions of the slide-lock plate slots 23 through 26 engage corresponding peripheral grooves of the clamping and alignment studs 46 through 49 which extend upwardly from the socket 50.

When the fixture is closed the pressure pad 43, which initially is spaced below the lid 34 by the action of the compression springs 65 through 68, is moved toward the lower major surface 60 of the lid 34, to a position wherein the upper surface 63 of the pressure pad 43 is closely adjacent to the lower surface of the pressure pad screw 77, and may even be in contact therewith.

Then the pressure pad screw knob 17 is moved clockwise (as seen in top plan view) to turn the pressure pad screw lever 16 and rotate the pressure pad screw 77 to press the pressure pad into higher pressure contact with the upper surface of the integrated circuit to be tested; the pressure so applied being limited to a predetermined range by engagement of the pressure pad screw lever 16 with the pressure pad screw lever stop screw/slide-lock plate screw 19. Then the integrated circuit is tested and the aforementioned procedure is repeated for the next integrated circuit to be tested.

Second Embodiment

The first embodiment of the invention, as described above, provides a hinge arrangement for opening and closing the test socket assembly, i.e. test fixture. Alternatively, the lid and slide-lock plate may be removed from and installed over the socket without employing such a hinge arrangement. This alternative configuration constitutes the second embodiment of the invention, and is shown in FIGS. 4 and 5, wherein those elements which correspond to elements of FIGS. 1 through 3D are identified by the same numerals followed by the letter "a".

Figure 5:
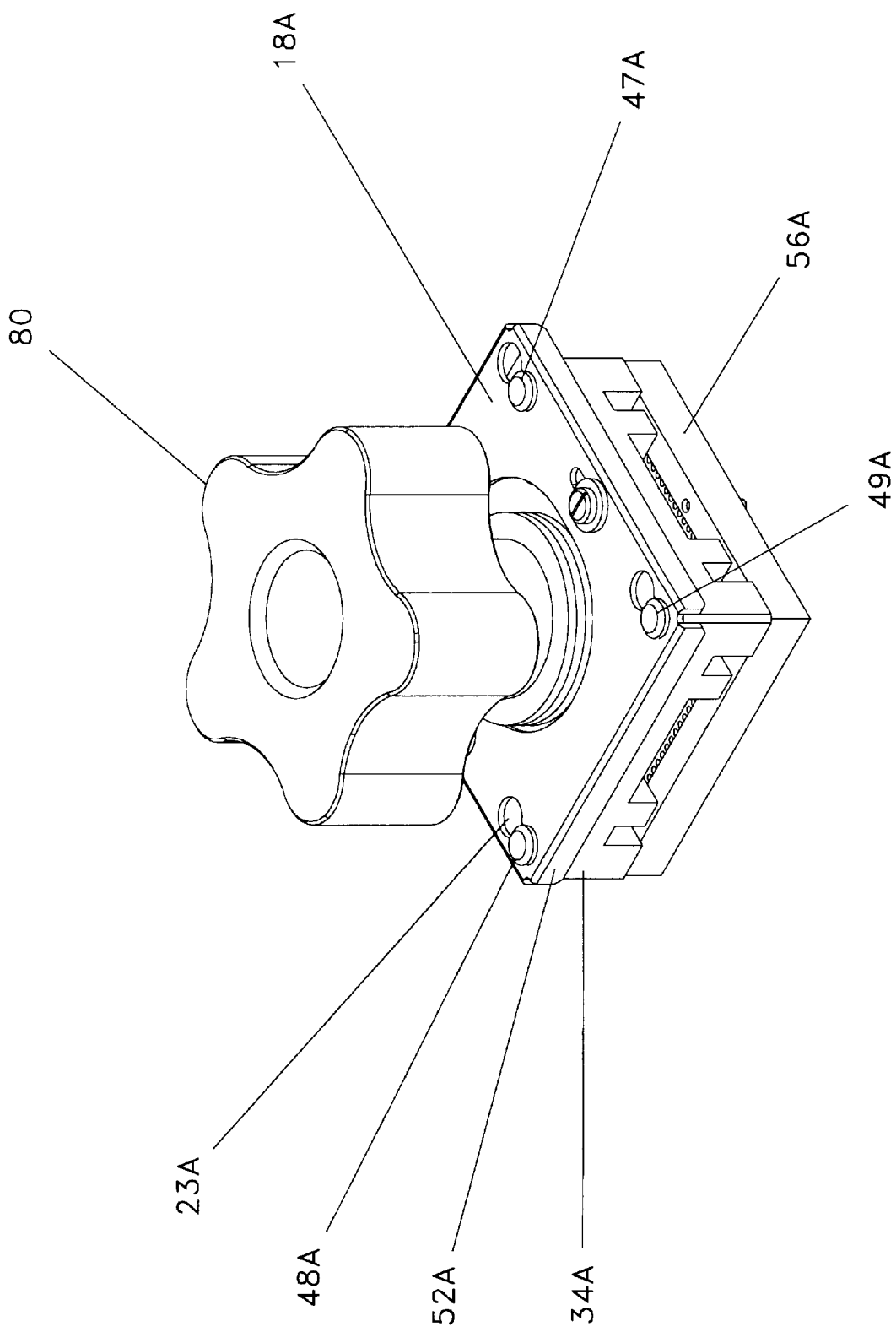
FIG. 5 is an isometric view of the test socket assembly of FIG. 4.

The construction of the embodiment shown in FIGS. 4 and 5 is otherwise essentially the same as in the first embodiment, except that no hinge arrangement is employed, and the pressure pad screw 77a is rotated by a knob 80 rather than the knob 17 and lever 16 used to rotate the screw 77 of the first embodiment.

In the second embodiment, in order to allow removal of the lid 34a (with attached pressure plate 43a) and slide-lock plate 18a, the knob 80 is provided with a non-circular, e.g. hexagonal end which engages a corresponding central hole in the pressure pad screw 77a; and the knob is simply unplugged from the pressure pad screw when the lid and slide-lock plate are to be removed.

We claim:

1. A socket assembly for electrically connecting an integrated circuit to a printed circuit board, comprising:

an integrated circuit socket for accommodating an integrated circuit, said socket having an array of contacts arranged to engage corresponding contacts of the integrated circuit, said socket having a plurality of peripheral clamping and alignment studs extending upwardly therefrom,
  each stud having a lower end portion secured to said socket and an upper end portion with a peripheral groove therein,
  two of said studs each having a transverse bearing hole disposed below the peripheral groove in the upper end portion thereof, said bearing holes being collinear;

a lid having upper and lower major surfaces with a generally central internally threaded circular hole extending between said major surfaces,
  said lid having a plurality of peripheral holes extending between said major surfaces for receiving corresponding ones of said studs,
    two of said peripheral holes extending to an adjacent end surface of said lid to form hinge recesses for accommodating the corresponding studs when the lid is rotated away from said socket,
  said lid having a bearing hole extending between side surfaces thereof in a direction generally parallel to said end surface, said bearing hole communicating with said two peripheral holes,
  said lid having a plurality of pressure pad retaining screw holes extending between said major surfaces outwardly of said internally threaded hole and inwardly of said peripheral holes;

a hinge pin extending through the bearing holes of said two studs and said lid so that said lid may rotate about said pin to pivot toward and away from said socket;

a pressure pad disposed below said lid and substantially parallel to the lower major surface thereof,
  said pressure pad being dimensioned to urge an integrated circuit accommodated in said socket toward said socket so that the contacts of the integrated circuit engage the corresponding array of contacts of the socket,
  said pressure pad being mounted to said lid for movement toward and away from said lower major surface thereof;

resilient means operatively associated with said lid for urging said pressure pad away from the lower major surface of the lid;

a slide-lock plate slidably disposed on the upper major surface of said lid,
  said slide-lock plate having a generally central access hole larger than the generally central circular hole in said lid in the direction in which said slide-lock plate is disposed for slidable movement on said lid, so that said generally central hole in said lid is and remains exposed through said access hole in said slide-lock plate as said slide-lock plate moves toward and away from said end surface of said lid,
  said slide-lock plate having slidable mounting means disposed on opposite sides of said access hole for allowing movement of said slide-lock plate toward and away from said end surface of said lid,
  said slide-lock plate having a plurality of stud-receiving slots for receiving corresponding ones of said upper end portions of said studs,
    each of said slots having a narrowed portion for engaging the peripheral groove of a corresponding one of said studs when said slide-lock plate is moved toward said end surface of said lid,
    two of said slots extending to an adjacent end surface of said slide-lock plate in juxtaposition with said end surface of said lid to form hinge recesses for accommodating the corresponding studs when the lid and slide-lock plate are rotated away from said socket;

slidable mounting means engaging means disposed adjacent the upper major surface of said lid on opposite sides of said generally central hole therein, for engaging the slidable mounting means of said slide-lock plate to slidably mount the slide-lock plate to the lid;

pressure pad screw means for urging said pressure pad toward said socket, to cause said pressure pad to press an integrated circuit accommodated in said socket against said socket so that the contacts of the integrated circuit engage the corresponding array of contacts of the socket,
  said screw means comprising (i) an externally threaded pressure pad screw extending through the access hole in said slide-lock plate and threadably engaged with said internally threaded hole of said lid, (ii) a pressure pad screw lever disposed above said slide-lock plate for rotating said pressure pad screw, and (iii) a pressure pad screw knob for turning said pressure pad screw lever; and pressure pad screw means stop means for limiting the angle through which said pressure pad screw lever may be turned.

2. The socket assembly according to claim 1, wherein each said slide-lock plate slidable mounting means comprises a slide-lock plate screw extending through a slot in said slide-lock plate, and each said slidable mounting means engaging means comprises an internally threaded hole in the upper major surface of said lid for threadably receiving a corresponding slide-lock plate screw.

3. The socket assembly according to claim 2, wherein said pressure pad screw means stop means comprises an elongated head portion of one of said slide-lock plate screws.

4. The socket assembly according to claim 1, 2 or 3, wherein said pressure pad is retained adjacent said lid by a plurality of pressure pad retaining screws extending through said lid, and said resilient means comprises a corresponding plurality of springs, each spring surrounding a corresponding one of said screws.

5. A socket assembly for electrically connecting an integrated circuit to a printed circuit board, comprising:

an integrated circuit socket for accommodating an integrated circuit, said socket having an array of contacts arranged to engage corresponding contacts of the integrated circuit, said socket having a plurality of peripheral clamping and alignment studs extending upwardly therefrom, each stud having a lower end portion secured to said socket and an upper end portion with a peripheral groove therein;

a lid having upper and lower major surfaces with a generally central internally threaded circular hole extending between said major surfaces, said lid having a plurality of peripheral holes extending between said major surfaces for receiving corresponding ones of said studs, said lid having a plurality of pressure pad retaining screw holes extending between said major surfaces outwardly of said internally threaded hole and inwardly of said peripheral holes;

a pressure pad disposed below said lid and substantially parallel to the lower major surface thereof, said pressure pad being dimensioned to urge an integrated circuit accommodated in said socket toward said socket so that the contacts of the integrated circuit engage the corresponding array of contacts of the socket, said pressure pad being mounted to said lid for movement toward and away from said lower major surface thereof;

resilient means operatively associated with said lid for urging said pressure pad away from the lower major surface of the lid;

a slide-lock plate slidably disposed on the upper major surface of said lid, said slide-lock plate having a generally central access hole larger than the generally central circular hole in said lid in the direction in which said slide-lock plate is disposed for slidable movement on said lid, so that said generally central hole in said lid is and remains exposed through said access hole in said slide-lock plate as said slide-lock plate moves toward and away from an end surface of said lid, said slide-lock plate having slidable mounting means disposed on opposite sides of said access hole for allowing movement of said slide-lock plate toward and away from said end surface of said lid, said slide-lock plate having a plurality of stud-receiving slots for receiving corresponding ones of said upper end portions of said studs, each of said slots having a narrowed portion for engaging the peripheral groove of a corresponding one of said studs when said slide-lock plate is moved toward said end surface of said lid;

slidable mounting means engaging means disposed adjacent the upper major surface of said lid on opposite sides of said generally central hole therein, for engaging the slidable mounting means of said slide-lock plate to slidably mount the slide-lock plate to the lid;

pressure pad screw means for urging said pressure pad toward said socket, to cause said pressure pad to press an integrated circuit accommodated in said socket against said socket so that the contacts of the integrated circuit engage the corresponding array of contacts of the socket, said screw means comprising (i) an externally threaded pressure pad screw extending through the access hole in said slide-lock plate and threadably engaged with said internally threaded hole of said lid, and (ii) means for rotating said pressure pad screw means.

6. The socket assembly according to claim 5, wherein each said slide-lock plate slidable mounting means comprises a slide-lock plate screw extending through a slot in said slide-lock plate, and each said slidable mounting means engaging means comprises an internally threaded hole in the upper major surface of said lid for threadably receiving a corresponding slide-lock plate screw.

7. The socket assembly according to claim 5 or 6, wherein said pressure pad is retained adjacent said lid by a plurality of pressure pad retaining screws extending through said lid, and said resilient means comprises a corresponding plurality of springs, each spring surrounding a corresponding one of said screws.

8. A socket assembly for electrically connecting an integrated circuit to a printed circuit board, comprising:

an integrated circuit socket for accommodating an integrated circuit, said socket having an array of contacts arranged to engage corresponding contacts of the integrated circuit, said socket having clamping and alignment means extending upwardly therefrom, socket hinge means operatively associated with said socket;

a lid having upper and lower major surfaces with a generally central internally threaded circular hole extending between said major surfaces, said lid having alignment means for engaging the clamping and alignment means extending upwardly from said socket, said lid having lid hinge means extending between side surfaces thereof in a direction generally parallel to an end surface thereof, and cooperating with said socket hinge means to form a hinge permitting rotation of said lid with respect to said socket, about an axis near said end surface of said lid, said lid having pressure pad retaining means secured thereto;

a pressure pad disposed below said lid and substantially parallel to the lower major surface thereof, said pressure pad being mounted to said pressure pad retaining means for movement toward and away from said lower major surface thereof, said pressure pad being dimensioned to urge an integrated circuit accommodated in said socket toward said socket so that the contacts of the integrated circuit engage the corresponding array of contacts of the socket;

a slide-lock plate slidably mounted on the upper major surface of said lid for movement toward and away from said end surface of said lid; and pressure applying means for urging said pressure pad toward said socket, to cause said pressure pad to press an integrated circuit accommodated in said socket against said socket so that the contacts of the integrated circuit engage the corresponding array of contacts of the socket.

9. A socket assembly for electrically connecting an integrated circuit to a printed circuit board, comprising:

an integrated circuit socket for accommodating an integrated circuit, said socket having an array of contacts arranged to engage corresponding contacts of the integrated circuit, said socket having clamping and alignment means extending upwardly therefrom;

socket hinge means operatively associated with said socket;

a lid having upper and lower major surfaces with a generally central internally threaded circular hole extending between said major surfaces, said lid having alignment means for engaging the clamping and alignment means extending upwardly from said socket, said lid having lid hinge means extending between side surfaces thereof in a direction generally parallel to an end surface thereof, and cooperating with said socket hinge means to form a hinge permitting rotation of said lid with respect to said socket, about an axis near said end surface of said lid, said lid having pressure pad retaining means secured thereto;

a pressure pad disposed below said lid and substantially parallel to the lower major surface thereof, said pressure pad being mounted to said pressure pad retaining means for movement toward and away from said lower major surface thereof, said pressure pad being dimensioned to urge an integrated circuit accommodated in said socket toward said socket so that the contacts of the integrated circuit engage the corresponding array of contacts of the socket;

a slide-lock plate slidably mounted on the upper major surface of said lid for movement toward and away from said end surface of said lid, said slide-lock plate having means for engaging the clamping and alignment means of said socket; and pressure applying means operatively associated with said lid for urging said pressure pad toward said socket, to cause said pressure pad to press an integrated circuit accommodated in said socket against said socket so that the contacts of the integrated circuit engage the corresponding array of contacts of the socket.

10. The socket assembly according to claim 9, wherein said socket hinge means comprises:

two studs extending upwardly from said socket, said studs each having a transverse bearing hole disposed below the peripheral groove in the upper end portion thereof, said bearing holes being collinear, said lid having a bearing hole extending between side surfaces thereof in a direction generally parallel to said end surface, and a hinge pin extending through the bearing holes of said two studs and said lid so that said lid may rotate about said pin to pivot toward and away from said socket.

11. The socket assembly according to claim 9 or 10, wherein said clamping and alignment means comprises a plurality of studs extending upwardly from said socket, each stud having a peripheral groove adjacent the upper end thereof.

12. The socket assembly according to claim 11, wherein said slide-lock plate has a generally central oval hole larger than the generally central circular hole in said lid and elongated in the direction of slidable movement of said slide-lock plate on said lid, so that said generally central hole in said lid is and remains exposed through said oval hole in said slide-lock plate as said slide-lock plate moves toward and away from said end surface of said lid, said slide-lock plate having slidable mounting means disposed on opposite sides of said oval hole for allowing movement of said slide-lock plate toward and away from said end surface of said lid, said slide-lock plate having stud-receiving slots for receiving corresponding ones of said upper end portions of said studs, each of said slots having a narrowed portion for engaging the peripheral groove of a corresponding one of said studs when said slide-lock plate is moved toward said end surface of said lid, two of said slots extending to an adjacent end surface of said slide-lock plate in juxtaposition with said end surface of said lid to form hinge recesses for accommodating corresponding studs when the lid and slide-lock plate are rotated away from said socket.

13. The socket assembly according to claim 11, wherein said pressure applying means comprises pressure pad screw means for urging said pressure pad toward said socket, to cause said pressure pad to press an integrated circuit accommodated in said socket against said socket so that the contacts of the integrated circuit engage the corresponding array of contacts of the socket.

14. The socket assembly according to claim 13, wherein said pressure pad screw means comprises (i) an externally threaded pressure pad screw extending through the oval hole in said slide-lock plate and threadably engaged with said internally threaded hole of said lid, (ii) a pressure pad screw lever disposed above said slide-lock plate for rotating said pressure pad screw, and (iii) a pressure pad screw knob for turning said pressure pad screw lever.

15. The socket assembly according to claim 14, further comprising pressure pad screw means stop means for limiting the angle through which said pressure pad screw lever may be turned.

16. A socket assembly for electrically connecting an integrated circuit to a printed circuit board, comprising:

an integrated circuit socket for accommodating an integrated circuit, said socket having an array of contacts arranged to engage corresponding contacts of the integrated circuit, said socket having clamping and alignment means extending upwardly therefrom;

a lid having upper and lower major surfaces with a generally central internally threaded circular hole extending between said major surfaces, said lid having alignment means for engaging the clamping and alignment means extending upwardly from said socket, said lid having pressure pad retaining means secured thereto;

a pressure pad disposed below said lid and substantially parallel to the lower major surface thereof, said pressure pad being mounted to said pressure pad retaining means for movement toward and away from said lower major surface thereof, said pressure pad being dimensioned to urge an integrated circuit accommodated in said socket toward said socket so that the contacts of the integrated circuit engage the corresponding array of contacts of the socket;

a slide-lock plate slidably mounted on the upper major surface of said lid for movement toward and away from an end surface of said lid, said slide-lock plate having means for engaging the clamping and alignment means of said socket; and means operatively associated with said lid for urging said pressure pad toward said socket, to cause said pressure pad to press an integrated circuit accommodated in said socket against said socket so that the contacts of the integrated circuit engage the corresponding array of contacts of the socket.

17. The socket assembly according to claim 16, wherein said clamping and alignment means comprises a plurality of studs extending upwardly from said socket, each stud having a peripheral groove adjacent the upper end thereof.

18. The socket assembly according to claim 16 or 17, wherein said slide-lock plate has a generally central oval hole larger than the generally central circular hole in said lid and elongated in the direction of slidable movement of said slide-lock plate on said lid, so that said generally central hole in said lid is and remains exposed through said oval hole in said slide-lock plate as said slide-lock plate moves toward and away from said end surface of said lid, said slide-lock plate having slidable mounting means disposed on opposite sides of said oval hole for allowing movement of said slide-lock plate toward and away from said end surface of said lid, said slide-lock plate having stud-receiving slots for receiving corresponding ones of said upper end portions of said studs, each of said slots having a narrowed portion for engaging the peripheral groove of a corresponding one of said studs when said slide-lock plate is moved toward said end surface of said lid.

19. The socket assembly according to claim 18, wherein said pressure applying means comprises pressure pad screw means for urging said pressure pad toward said socket, to cause said pressure pad to press an integrated circuit accommodated in said socket against said socket so that the contacts of the integrated circuit engage the corresponding array of contacts of the socket.

20. The socket assembly according to claim 19, wherein said pressure pad screw means comprises (i) an externally threaded pressure pad screw extending through the oval hole in said slide-lock plate and threadably engaged with said internally threaded hole of said lid, and (ii) means for rotating said pressure pad screw.

* * * * *